(12) United States Patent
Akamatsu et al.

(10) Patent No.: US 8,172,993 B2
(45) Date of Patent: May 8, 2012

(54) MAGNETRON SPUTTERING ELECTRODE, AND SPUTTERING APPARATUS PROVIDED WITH MAGNETRON SPUTTERING ELECTRODE

(75) Inventors: Yasuhiko Akamatsu, Chiba (JP); Tatsunori Isobe, Chiba (JP); Makoto Arai, Chiba (JP); Junya Kiyota, Chiba (JP); Takashi Komatsu, Chiba (JP)

(73) Assignee: Ulvac, Inc., Kanagawa (JP)

( * ) Notice: Subject to any disclaimer, the term of this patent is extended or adjusted under 35 U.S.C. 154(b) by 352 days.

(21) Appl. No.: 12/514,513

(22) PCT Filed: Nov. 13, 2007

(86) PCT No.: PCT/JP2007/071965
§ 371 (c)(1),
(2), (4) Date: Jun. 5, 2009

(87) PCT Pub. No.: WO2008/059814
PCT Pub. Date: May 22, 2008

(65) Prior Publication Data
US 2010/0051454 A1    Mar. 4, 2010

(30) Foreign Application Priority Data

Nov. 17, 2006  (JP) ................................. 2006-311623
Nov. 17, 2006  (JP) ................................. 2006-311624

(51) Int. Cl.
*C23C 14/35* (2006.01)
(52) U.S. Cl. ................................ 204/298.19; 204/298.2
(58) Field of Classification Search ............. 204/298.19, 204/298.2
See application file for complete search history.

(56) References Cited

U.S. PATENT DOCUMENTS
2005/0178660 A1 *  8/2005  Lopp et al. ................. 204/298.2

FOREIGN PATENT DOCUMENTS

| JP | 09-020979 |   | 1/1997 |
|----|-----------|---|--------|
| JP | 11-092927 | * | 4/1999 |
| JP | 2000-188265 |   | 7/2000 |
| JP | 2001-271163 |   | 10/2001 |
| JP | 2004-115841 |   | 4/2004 |
| JP | 2006-037127 |   | 2/2006 |

OTHER PUBLICATIONS

Machine Translation of JP 11-092927 dated Apr. 1999.*
International Search Report for PCT Patent App. No. PCT/JP2007/071965 (Jan. 22, 2008).

* cited by examiner

*Primary Examiner* — Rodney McDonald
(74) *Attorney, Agent, or Firm* — Cermak Nakajima LLP; Tomoko Nakajima

(57) ABSTRACT

In a magnetron sputtering apparatus an arrangement is made such that the peripheral portion of a target is uniformly eroded to attain a high efficiency in target utilization and, in addition, that an abnormal discharging hardly occurs to thereby enable satisfactory thin film forming. A magnet assembly is provided behind a target that is disposed opposite to the process substrate. This magnet assembly has a central magnet that is disposed linearly along the longitudinal direction, and a peripheral magnet that is disposed so as to enclose the periphery of the central magnet, while changing the polarity on the side of the target. At this time, among the respective magnetic fluxes generated between the central magnet and the peripheral magnet at the longitudinally end portions of the magnet assembly, the position at which the vertical component of the magnetic field becomes zero is locally shifted to the central magnet within a certain range.

13 Claims, 7 Drawing Sheets

MAGNETRON SPUTTERING ELECTRODE, AND SPUTTERING APPARATUS PROVIDED WITH MAGNETRON SPUTTERING ELECTRODE

This application is a national phase entry under 35 U.S.C. §371 of PCT Patent Application No. PCT/JP2007/071965, filed on Nov. 13, 2007, which claims priority under 35 U.S.C. §119 to Japanese Patent Application Nos. 2006-311623, filed Nov. 17, 2006, and 2006-311624, filed Nov. 17, 2006, all of which are incorporated by reference.

FIELD OF THE INVENTION

The present invention relates to a magnetron sputtering electrode for forming a predetermined thin film on a process substrate by magnetron sputtering system, and also relates to a sputtering apparatus provided with the magnetron sputtering electrode.

BACKGROUND ART

In this kind of sputtering apparatus there is provided a magnet assembly for forming a tunnel-shaped magnetic flux in front of the target (on the side of the surface to be sputtered). At the time of sputtering the target by charging negative DC voltage or AC voltage to the target, the electrons ionized in front of the target or the secondary electrons generated by the sputtering are arrested to thereby enhance the electron density in front of the target. By thus increasing the probability of collision of these electrons with the gas molecules of an inert gas to be introduced into a vacuum chamber, the plasma density is increased. As a result, there is an advantage in that the film forming speed can be improved without bringing about a remarkable increase in temperature in, e.g., the process substrate, and the like. The art is often used in forming a metallic film and the like on the process substrate.

As the magnet assembly to be assembled into this kind of sputtering apparatus, there is known one which is constituted by: a supporting plate (yoke) which is provided in parallel with the target; a central magnet which is disposed substantially in the upper center of the supporting plate along the longitudinal direction thereof and a peripheral magnet which is disposed so as to enclose the central magnet while changing the polarity on the target side (Patent Document 1).

Patent Document 1: JP-A-2004-115841 (see, e.g., the column of Prior Art)

DISCLOSURE OF THE INVENTION

Problems to be Solved by the Invention

At the time of sputtering by using the above-described sputtering apparatus, the electrons in the plasma generated in a racetrack shape in front of the target are moving in the clockwise or counterclockwise direction along the racetrack depending on the target-side polarity of the central magnet and the peripheral magnet. When the electrons reach the end portion of the target, they are bent by the electromagnetic field and change the direction. However, at the time of changing the direction, the inertial movement remains, whereby the electrons jump out of the end side of the target.

When the electrons jump out of the end side of the target due to the inertial movement, plasma is locally enlarged, whereby the erosion region of the target is extended toward target end side. As a result, the electric discharge becomes unstable and there is a possibility that good film formation is impeded. In addition, in horizontally reciprocating the magnet assembly along the target in order to make uniform the erosion region of the target associated with the progress of sputtering, it is necessary to decrease the size of the magnet assembly and the amount of movement when taking into consideration the above-described jumping out of the electrons. This solution, on the other hand, will positively bring about an increase in the non-eroded region, resulting in poor utilization efficiency of the target.

In view of the above-described points, it is a problem of this invention to provide a magnetron sputtering electrode, and a sputtering apparatus provided with the magnetron sputtering electrode, in which the peripheral portion of the target can be uniformly eroded to thereby enable to form an acceptable thin film and, in addition, in which an efficiency in utilizing the target can be increased.

Means for Solving the Problems

In order to solve the above problems, a magnetron sputtering electrode according to claim 1 is provided with a magnet assembly disposed behind a target opposite to a process substrate. The magnet assembly comprises: a central magnet disposed linearly along a longitudinal direction; and a peripheral magnet disposed so as to enclose the central magnet with a polarity on a side of the target different from the polarity of the central magnet. A position in which a vertical component of a magnetic field becomes zero in respective magnetic fluxes generated in a tunnel shape between the central magnet and the peripheral magnet at both longitudinal end portions of the magnet assembly is shifted to the central magnet within a certain range.

According to this invention, the position in which the vertical component of the magnetic field becomes zero is locally shifted to the central magnet within a certain range. Therefore, if the shifted range of the position in which the vertical component of the magnetic field becomes zero is made to correspond to the portion in which the jumping out of the electrons takes place, the electrons will not jump out toward the target end side even in case the inertial movement remains when the electrons reach the end portions of the target to thereby turn the orientation by being bent by the magnetic field. The plasma can thus be prevented from locally expanding. As a result, stable electric discharging can be made at the time of sputtering and satisfactory thin film forming becomes possible.

Preferably the range of shifting the position in which the vertical component of the magnetic field becomes zero lies on one side of the central magnet in a manner to be diagonally crossing with each other on both end portions of the central magnet. According to this configuration, in case, e.g., the magnet assembly is reciprocated, only in the place in which the electrons jump out toward the target end side due to inertial movement, the position in which the vertical component of the magnetic field becomes zero is shifted to a side opposite to the one in which the electrons jump out. In this manner, the erosion region of the target associated with the progress of sputtering in the peripheral portion of the target can be made uniform, and the distance of movement of the magnet assembly can be made large.

Here, in order to shift, within a certain range, the position in which the vertical component of the magnetic field becomes zero, the magnetic force of at least one of the central magnet and the peripheral magnet may be locally strengthened or weakened.

If a predetermined length of magnetic shunt is disposed on a side surface of longitudinal both ends of the central magnet, the magnetic force in the range, out of the central magnet, in which the magnetic shunt is disposed becomes locally weakened. Therefore, without changing the mode of the magnet assembly itself, the position in which the vertical component of the magnetic field becomes zero can advantageously be shifted to the side opposite to the direction of jumping out of the electrons.

Preferably the peripheral magnet comprises: a straight portion elongated in parallel on both sides of the central magnet; and a turned portion that bridges the straight portions. The straight portions of the central magnet and of the peripheral magnet are at an equal distance to each other, and the distance between the central magnet and each of the straight portions is made smaller at both longitudinal end portions of the magnet assembly than at a central region of the magnet assembly. The position at which a vertical component of the magnetic field becomes zero is shifted.

In this case, depending on the polarity on the side of the target, one of the straight portions and both end portions of the central magnet are preferably moved toward the other of the straight portions to thereby narrow the distance. Both end portions are rotational symmetry. At the time of reciprocating the magnet assembly the position in which the vertical component of the magnetic field becomes zero may be shifted, similar to the above, in a certain range to the side opposite to the direction of jumping out of the electrons only at the portion where the electrons are jumped out toward the target end side due to the inertial movement by the reciprocal movement. The erosion region associated with the progress of the sputtering in the peripheral portion of the target can thus be made uniform.

Here, in case one of the straight portions and part of both sides of the central magnet are moved toward the other of the straight portions to thereby narrow the distance, there are cases where, due to the above, the position in which the vertical component of the magnetic field positioned on the side opposite to the direction of jumping out of the electrons partly becomes zero is locally shifted to the target end side. In this state, part of the plasma generated in the racetrack shape will be extended toward the target end side. As a solution, if a magnetic shunt is disposed on a side surface of the other of the straight portions out of both end portions of the central magnet, the magnetic force in the place where the magnetic shunt is disposed out of the central magnet is locally weakened. In this manner, the position in which the vertical component of the magnetic field becomes zero can advantageously be shifted in the direction of jumping out of the electrons again for correction once again.

On the other hand, in order to correct again the position at which the vertical component becomes zero, in addition to the above or in place thereof, at least part of the portion lying opposite to longitudinal both end portions of the magnet assembly may be moved to the central magnet.

Further, an auxiliary magnet may be added at least to an upper surface of the portions that lie opposite to longitudinal both end portions of the magnet assembly to thereby locally strengthen part of the magnetic force of the peripheral magnet so that the position at which the vertical component of the magnetic field becomes zero is shifted in the direction of jumping out of the electrons for correction once again.

Further, by further providing a driving means for reciprocating the magnet assembly in parallel with a rear surface of the target, the region of erosion of the target associated with the progress of sputtering at the outer periphery of the target can be made uniform. The distance of movement of the magnet assembly can thus be made large and, as a result, high efficiency of utilization of the target can be attained.

In addition, in order to solve the above problems, the invention described in claim 11 is a sputtering apparatus comprising: a magnetron sputtering electrode according to any one of claims 1 through 10, disposed in a sputtering chamber that can be evacuated; a gas introducing means for introducing a predetermined gas into the sputtering chamber; and a sputtering power source that can charge electric power to the target.

EFFECT OF THE INVENTION

As described above, the magnetron sputtering electrode and a sputtering apparatus provided with the magnetron sputtering electrode have the advantage in that the efficiency in utilizing the target is high by uniform erosion of the peripheral portion of the target and also in that, by stabilizing the electric discharging, satisfactory thin film forming becomes possible.

BEST MODE FOR CARRYING OUT THE INVENTION

With reference to FIG. 1, reference numeral 1 denotes a sputtering apparatus of magnetron system provided with a magnetron sputtering electrode of this invention. This sputtering apparatus 1 is, e.g., of an inline system and has a sputtering chamber 11 that can be maintained at a predetermined degree of vacuum through an evacuating means (not illustrated) such as a rotary pump, a turbo-molecular pump and the like. In an upper space of the sputtering chamber 11 there is provided a substrate transporting means 2. The substrate transporting means 2 has a known construction and has, e.g., a carrier 21 for mounting thereon a process substrate S. By intermittently driving a driving means, the process substrate S can be sequentially transported to a position lying opposite to the target as described hereinafter.

The sputtering chamber 11 is provided with a gas introduction means 3. The gas introduction means 3 is in communication with a gas source 33 through a gas pipe 32 that has interposed therein a massflow controller 31, and thus is capable of introducing into the sputtering chamber 11, at a given flow rate, a sputtering gas such as argon or a reactant gas to be used in reactive sputtering. The reactant gas is selected depending on the composition of the thin film that is going to be formed on the process substrate S, and a gas inclusive of oxygen, nitrogen, carbon and hydrogen, ozone, water or hydrogen peroxide or a mixture gas thereof is used as the reactant gas. On a lower side of the sputtering chamber 11 there is disposed a magnetron sputtering electrode C.

The magnetron sputtering electrode C has a single target 41 of substantially rectangular parallelepiped (rectangle as seen in plan view) so disposed as to face the sputtering chamber 11. The target 41 is manufactured by a known method depending on the composition, such as Al alloy Mo, ITO and the like, of the thin film that is going to be formed on the process substrate S. The area of the surface 411 to be sputtered is set to be larger than the external dimensions of the process substrate S. The target 41 is kept bonded, during sputtering, through a bonding material such as indium and tin to a backing plate 42 that cools the target 41. The target 41 is mounted on a frame 44 of the magnetron sputtering electrode C through an insulating plate 43 such that, in a state in which the target 41 is bonded to the backing plate 42, the surface 411 of the target 41 to be sputtered lies opposite to the process substrate S. When the target 41 is mounted, a shield (not illustrated) which serves the purpose of a grounded anode is attached to the circumference of the target 41.

The magnetron sputtering electrode C has a magnet assembly 5 in a position behind the target 41 (i.e., on the side opposite to the surface 411 to be sputtered). The magnet assembly 5 has a supporting plate (yoke) 51 which is formed so as to be elongated on both sides of the target 41 along the longitudinal direction of the target 41. The supporting plate 51 is constituted by a flat plate of magnetic material that amplifies the attracting force of the magnet. Further, on the supporting plate 51 there are provided: a central magnet 52 (e.g., the polarity on the side of the target 41 is S) which is disposed to be positioned on the center line which extends in the longitudinal direction of the supporting plate 51; and a peripheral magnet 53 (the polarity on the side of the target 41 is N) which is disposed in an annular shape along the periphery of an upper surface of the supporting plate 51 by changing the polarity on the side of the target 41.

The peripheral magnet 53 is constituted by: straight portions 53a, 53b that extend in parallel with the central magnet 52; and each of turned portions 53c that bridge both the straight portions 53a, 53b. In this case, the distance between the central magnet 52 and both the straight portions 53a, 53b is constant. The volume of the central magnet 52 when converted to equivalent magnetization intensity and the sum of the volume of the enclosing peripheral magnet 53 when converted to the equivalent magnetization intensity are designed to be about peripheral magnet: central magnet: peripheral magnet=1:2:1 (see FIG. 1). According to this configuration, in front (on the side of the sputtering surface 411) of the target 41, there will be respectively formed a balanced closed loop, tunnel-like magnetic flux M. By capturing electrons ionized in front of the target 41 and the secondary electrons generated by sputtering, the electron density in front of the target 41 can be enhanced and the plasma density increased Then, the process substrate S is transported to the position lying opposite to the target 41. After introducing the predetermined sputtering gas or reactant gas through the gas introduction means 3, negative DC voltage or radiofrequency voltage is charged through sputtering power source (not illustrated) that is connected to the target 41. Then, an electric field vertical to the process substrate S or the target 41 is formed, and racetrack-shaped plasma is generated in front of the target 41 to thereby sputter the target 41. A predetermined thin film is thus formed on the process substrate S.

In the above-described magnet assembly 5, the plasma density above the central magnet 52 and the peripheral magnet 53 becomes low and, as compared with the surrounding thereof, the amount of erosion of the target 41 associated with the progress of sputtering becomes small. Therefore, an arrangement was made such that: the lateral width of the supporting plate 51 was sized smaller than the width of the target 41; a driving means 6 such as an air cylinder or a motor was provided; and the magnet assembly 5 was mounted on a driving shaft 61 of the driving means 6. It is then so arranged that during sputtering, the magnet assembly 5 is parallelly reciprocated at two horizontal positions along the widthwise direction (in a direction at right angles to the longitudinal direction of the central magnet 52) of the target 41, whereby the position of the tunnel-shaped magnetic flux is changed. According to this configuration, the target 41 can be eroded substantially uniformly over the entire surface inclusive of the peripheral portion thereof. In addition, as a result of two-dimensional reciprocating movement, the efficiency of utilization of the target 41 can further be increased.

According to the configuration of the above-described magnet assembly when racetrack-shaped plasma is caused to be generated in front of the target 41, the electrons in the plasma will be moving in the clockwise direction, as seen from the rear side of the target 41, along the race track T1, provided that the polarity on the side of the target 41 of the central magnet is S, and that the polarity on the side of the target 41 of the peripheral magnet is N. When the electrons have reached the end portion of the target 41, they will be turned by the electromagnetic field to thereby change the direction. At the time of turning, since there will remain an inertial movement, the electrons will jump over to the side of the target 41 and part of the racetrack-shaped plasma will locally be expanded toward the end of the target 41 (as shown in FIG. 2(a), on the left-lower side of the target 41, the electrons will jump over toward the lower side (X direction) and, on the right-upper side (not illustrated) of the target 41, on the other hand, the electrons will jump over toward the upper direction).

If the magnet assembly is reciprocated in this kind of state, part of the erosion region E1 of the target 41 will be locally extended toward the end of the target 41 (the region shown by reference alphabet R in FIG. 2(b)). As a result, the discharging will become unstable, whereby satisfactory thin film forming will be impeded. In view of this kind of jumping over of the electrons, it is considered to reduce the size of, or the amount of movement of, the magnet assembly 5. This idea, however, will positively increase the non-eroded region, resulting in poor efficiency of utilization of the target 41.

As a solution, as shown in FIG. 3(a), in the magnet assembly 5 according to the first embodiment of this invention, there was provided a magnetic shunt 7 along a side surface which is located in the direction X of jumping of the electrons out of both the end portions of the center magnet 52 (in other words, a magnetic shunt is mounted on diagonal or staggered side surfaces in respective end portions of the central magnet). In this case, if the target 41 has dimensions of 200×2500 mm, a maximum of 20 mm of jumping over of the electrons will occur at a position in a range of 100~250 mm from the end of the target 41. Then, the magnetic shunt 7 may be provided for a predetermined length (length up to 350 mm from longitudinal both ends of the magnet assembly 5) from both ends of the central magnet 52.

As the magnetic shunt 7, any material will be acceptable as long as it has a high maximum permeability and rigidity. For example, there may be used stainless steel having magnetic properties such as SUS 430 (according to Japanese Industrial Standards specification), metal such as pure iron and nickel in which the attenuation effect of the magnetic field can be increased, alloy which is high in magnetic permeability such as permalloy super permalloy and the like. The thickness of such material is set to a range of 1.0~5.0 mm.

According to this configuration, the magnetic force within a range in which magnetic shunt 7 has been provided in the central magnet 52 can be locally weakened. Therefore, without changing the mode of the magnet assembly 5 itself, and out of the respective tunnel-shaped magnetic fluxes generated between the central magnet 52 and the peripheral magnet 53, the position at which the vertical component of the magnetic field in the magnetic flux located in the region between the central magnet 52 provided with the magnetic shunt 7 and one 53a of the straight portions, becomes zero (the position at which the plasma density becomes high and contributes to the sputtering) will be shifted locally to the side of the central magnet 52 within a range of the length of the magnetic shunt 7. In other words, let us look at the track-shaped line L1 which passes through the position in which the vertical component of the magnetic field becomes zero. Out of this line L1 the portion which is positioned on one side of the central magnet 52 and which is positioned in a staggered manner at both ends of the central magnet 52, is locally shifted to become the line L1 as shown in FIG. 3(b). Therefore, in case plasma is generated in front of the target 41, even if an inertial movement may remain when the electrons come to the end portion of the target 41 and are turned by the electromagnetic field, the electrons are prevented from jumping out to the target 41 end side. The plasma is thus prevented from locally expanded.

As a result, the erosion region E2 associated with the progress of sputtering at the peripheral portion of the target 41 can be made substantially linear along the longitudinal direction of the target 41 (see FIG. 3(c)). Stable discharging can be performed at the time of sputtering, whereby satisfactory thin film forming becomes possible. Further, during sputtering, even if the magnet assembly 5 is reciprocated along the widthwise direction of the target 41, the distance of movement of the magnet assembly 5 relative to the target can be made large. Therefore, erosion can be made substantially uniform over the entire surface of the target 41, inclusive of the peripheral portion thereof. The efficiency of utilization of the target 41 can thus be further improved.

In the above-described first embodiment of the invention, a description has been made of the configuration in which the magnetic shunt 7 was provided on the side surfaces of the central magnet 52 in order to locally strengthen or weaken at least one magnetic force of the central magnet 52 and the peripheral magnet 53 without changing the mode of the magnetic assembly 5 itself. Without being limited thereto, an arrangement may be made: such that out of one of the straight portions 53a of the peripheral magnet 53, only the portion that lies opposite to the position of providing the magnetic shunt 7 may be changed to a magnet having a stronger magnetic force; or that an auxiliary magnet is mounted on an upper surface of that portion so that the magnetic force of the peripheral magnet 53 may be locally reinforced. On the other hand, in order to locally shift the position in which the vertical component of the magnetic field becomes zero to the side of the central magnet 52, the magnet assembly 50 may be arranged as follows.

Description will be made with reference to FIG. 4. The magnet assembly 50 according to the second Embodiment has the following configuration. That is, in longitudinal both end portions of the magnet assembly 50, while the distance between the central magnet 52 and both straight portions 53a, 53b of the peripheral magnet 53 is kept constant, the distance between the central magnet 52 and each of the straight portions 53a, 53b becomes smaller than the corresponding distance at the central region of the magnet assembly 50. Longitudinal both end portions of the magnet assembly 50 whose distance is respectively made smaller are arranged to become rotational symmetry. In other words, both end portions 521, 522 out of the central magnet 52 and both end portions 531, 532 of one 53a of the straight portions (the other straight portion 53b on the other end of the central magnet) are moved stepwise to the side of the other straight portion 53b (the one straight portion 53a on the other end of the central magnet) that is located on the opposite side of the direction X of jumping out of the electrons. The distances D2, D3 are thus arranged to become smaller and smaller toward longitudinal both ends than the distance D1 in the central region of the magnet assembly 50.

Here, as described above, when the target 41 has the dimensions of 200×2500 mm, the jumping out of the electrons of about maximum 20 mm will take place at a position in a range of 100~250 mm from the ends of the target 41. Therefore, the regions of about 350 mm from both longitudinal ends of the magnet assembly 5 are defined to be the longitudinal both end portions of the magnet assembly 5. At these end portions the distances D2, D3 are made smaller by the width (e.g., below 30 mm) depending on the distance of jumping out of the electrons. In this case, if the distance from the longitudinal both ends becomes larger than 350 mm, the non-eroded region will become larger.

According to the above configuration, among the magnetic fluxes generated in the tunnel shape between the central magnet 52 and the peripheral magnet 53, the position at which the vertical component of the magnetic field positioned in the regions in which the distance was made locally smaller becomes zero (the position at which the plasma density becomes the highest, contributing to the sputtering of the target) will be locally shifted to the side of the central magnet 52 within a certain range. In other words, as shown in FIG. 4(b), looking at the racetrack-shaped line L2 that respectively passes through the position where the vertical component of the magnetic field becomes zero, the following can be seen. In other words, by moving both end portions 521, 522 of the central magnet 52 and both end portions 531, 532 of one 53a of the straight portions to the side of the other 53b of the straight portions, the other 53b being located on the opposite side as seen in the direction X in which the electrons jump out, the line L2 that is positioned on the side of one 53a of the straight portions is shifted to the central magnet 52 side within this moved region.

Therefore, like the above-described first embodiment, when the plasma is generated in front of the target 41, the electrons are prevented from jumping out to the target 41 end side even if there remains an inertial movement at the time when the electrons reach the end portion of the target 41 and are turned in the electromagnetic field; therefore, there is no possibility that the plasma will be expanded locally. As a result, the erosion region E3 of the target associated with the progress of sputtering in the peripheral portion of the target 41 can be made substantially linear along the longitudinal direction of the target 41 (see FIG. 4(c)), thereby stable discharging at the time of sputtering and satisfactory thin film forming becomes possible. Further, during sputtering, even if the magnet assembly 5 is reciprocated along the widthwise direction of the target 41, the distance of movement of the magnet assembly 5 relative to the target can be made large. Therefore, erosion can be made substantially uniform over the entire surface of the target 41, inclusive of the peripheral portion thereof. The efficiency of utilization of the target 41 can thus be further improved.

In case the magnet assembly 50 is constituted as described above, there are cases where, due to the above constitution, the position which lies in the side opposite to the direction of jumping out of the electrons and in which the vertical component of the magnetic field becomes zero is locally shifted, in a certain range, to the side opposite to the direction of jumping out of the electrons. In other words, as shown in FIG. 4(b), looking at the racetrack-shaped line L2 that respectively passes through the position at which the vertical component of the magnetic field becomes zero, the range La that is located on the side of the other 53b of the straight portions of line L2 will be shifted, in the region in which the central magnet 52 and one 53a of the straight portions have been moved, in a manner to be swelled to the side opposite to the direction of jumping out of the electrons. In this case, there is a possibility that part of the plasma generated in the racetrack shape will be expanded to the target 41 end side, and that the erosion region E3 will be slightly extended in the direction of the target 41. As a solution, as shown in FIG. 5(a), it is preferable to provide the side surface of the portion 522 that has been moved toward the other 53b of the straight portions out of the central magnet 53b with a magnetic shunt 71.

According to this configuration, the magnetic force can be locally weakened at the position, within the central magnet 52, where the magnetic shunt 71 was disposed. The position at which the vertical component of the magnetic field becomes zero is shifted in position to the direction in which the electrons are jumped out, thereby correcting the swelling once again. In other words, out of the line L2, the region La which is swelled outer than the other 53b of the straight portions is shifted to the central magnet 52, thereby becoming a racetrack-shaped line L3 as shown in FIG. 5(b). As a result, the erosion region of the target 41 associated with the progress of the sputtering at the peripheral portion of the target 41 can be made uniform into a more linear shape along the longitudinal direction of the target 41.

As the magnetic shunt 7 there can be used, like in the above-described first embodiment, metals such as pure iron, nickel and the like and alloys having a high magnetic permeability such as permalloy supermalloy and the like. The thickness thereof is set to the range of 1.0~5.0 mm and is mounted over the entire length, e.g., of the portion 522 which has been moved toward the straight portion 53b.

On the other hand, as shown in FIG. 6, in order to correct once again the swelling of the racetrack-shaped line L2, the following may be employed in addition to the above or in place thereof. That is, out of the other 53b of the straight portions, at least part 530 of the portion which lies opposite to both longitudinal end portions of the magnet assembly 5, or preferably the portion corresponding to the swelled region La of the line L2, may be moved toward the central magnet 52. According to this configuration, the swelling can be corrected again by shifting to the central magnet 52 so as to be the racetrack shape L4 as shown in FIG. 6(b).

In addition, as shown in FIG. 7, in order to correct again the swelling of the racetrack-shaped line L2, in addition to the above or in place thereof, there may be added an auxiliary magnet 8, out of the other 53b of the straight portions, to at least a portion lying opposite to the longitudinally both end portions of the magnet assembly preferably on an upper surface of the portion corresponding to the region La where the line L2 is swelled. According to this configuration, the magnetic force is locally enforced at the portion where the auxiliary magnet 8 was provided, and the position at which the vertical component of the magnetic field becomes zero can be shifted to thereby correct once again the swelling.

In the above-described second embodiment, a description was made of the example in which, out of consideration of manufacturing the magnet assembly 50, a stepwise movement was made, out of the central magnet 52, in both end portions 521, 522 and both end portions 531, 532 of one 53a of the straight portions toward the other 53b of the straight portions. Without being limited thereto, an arrangement may be made, depending on the width of the jumping out of the electrons, such that the above-described distance is continuously varied toward longitudinal both ends of the magnet assembly 5.

Further, in the above-described first and second embodiments, descriptions were made of a magnetron sputtering electrode C having disposed a single target 41. Without being limited thereto, this invention can be applied to an arrangement in which a plurality of targets 41 are disposed in parallel with one another relative to the process substrate S. In case a plurality of targets 41 are disposed in parallel with one another, if the electrons jump out to the outside from the target end due to inertial movement thereof, the electrons are likely to fly to the adjoining targets, thereby making the electric discharge unstable. However, by applying this invention, the electrons are prevented from flying to the adjoining targets and the electric discharge can be stabilized. As a result, satisfactory thin film forming becomes possible.

Figure 1:
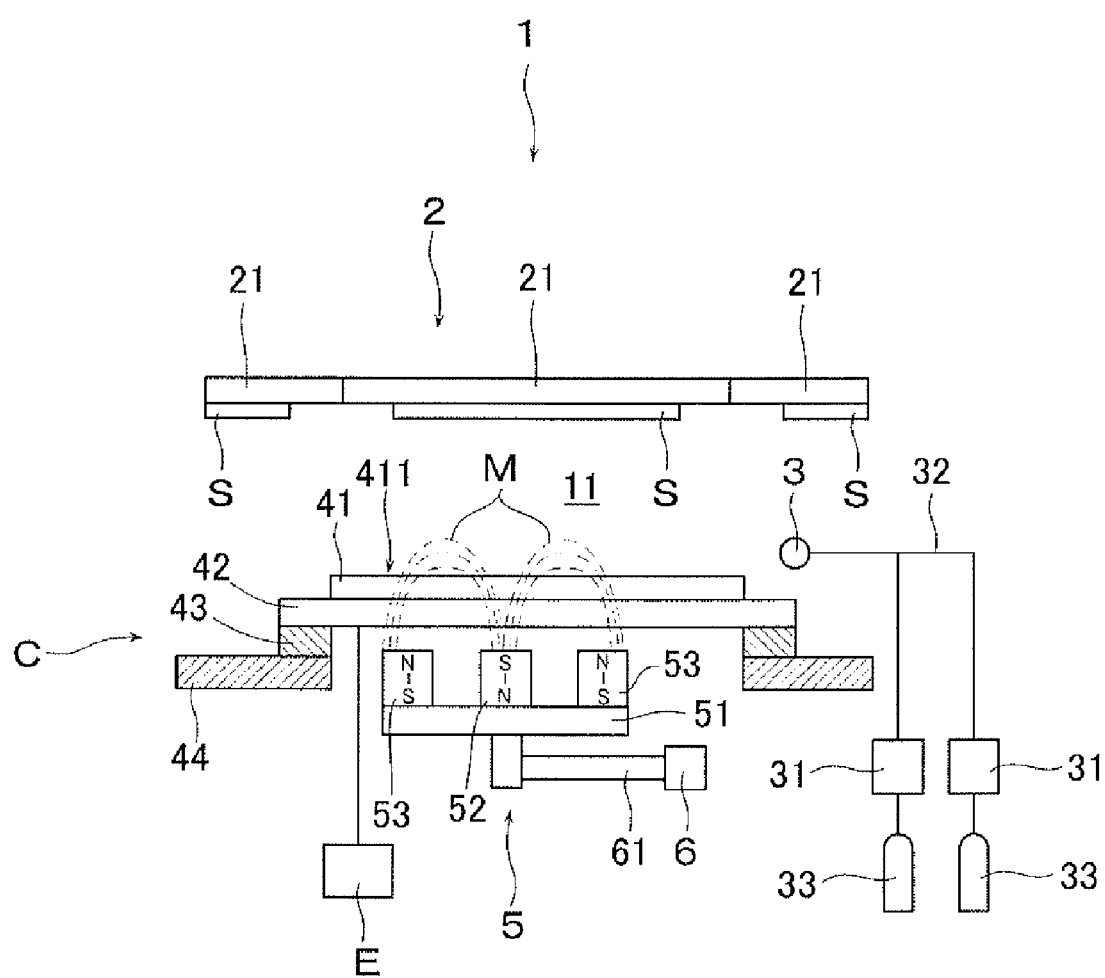
FIG. 1 is a side view schematically explaining the sputtering apparatus of this invention.
Figure 2A:
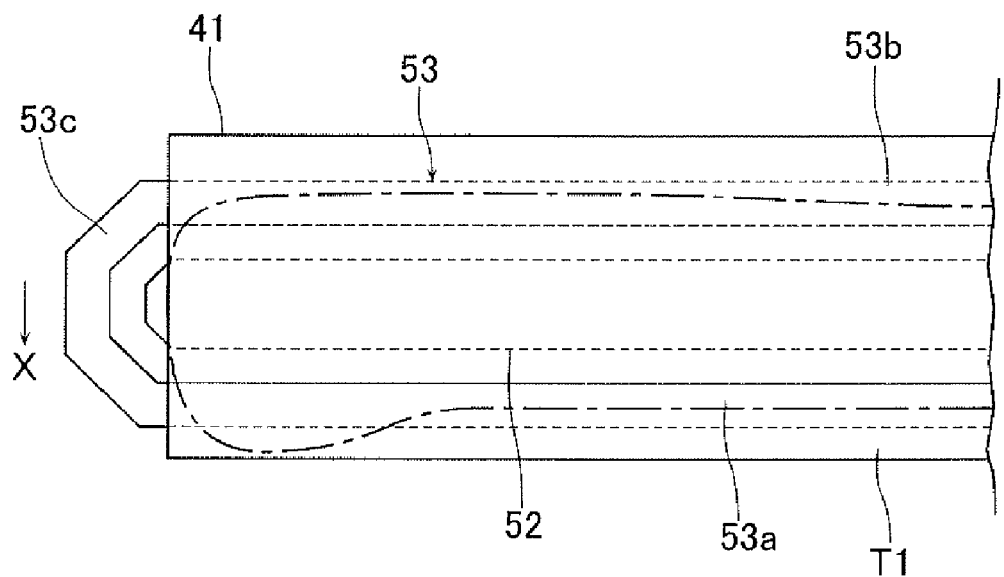
FIG. 2(a) is a view explaining the constitution of conventional magnet assembly and FIG. 2(b) is a view explaining the jumping out of the electrons.
Figure 2B:
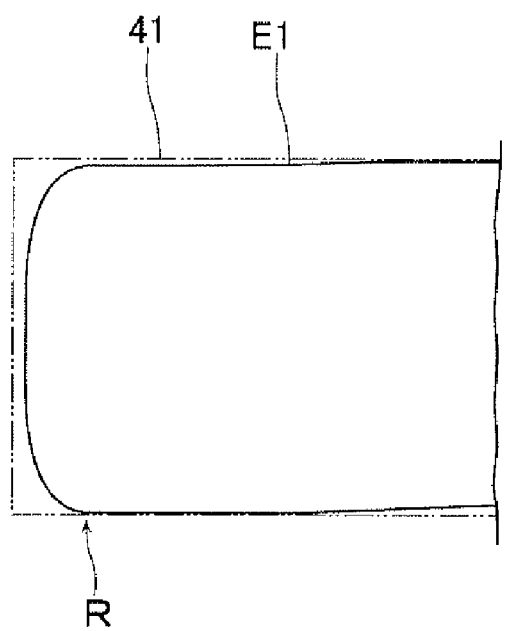
Figure 3A:
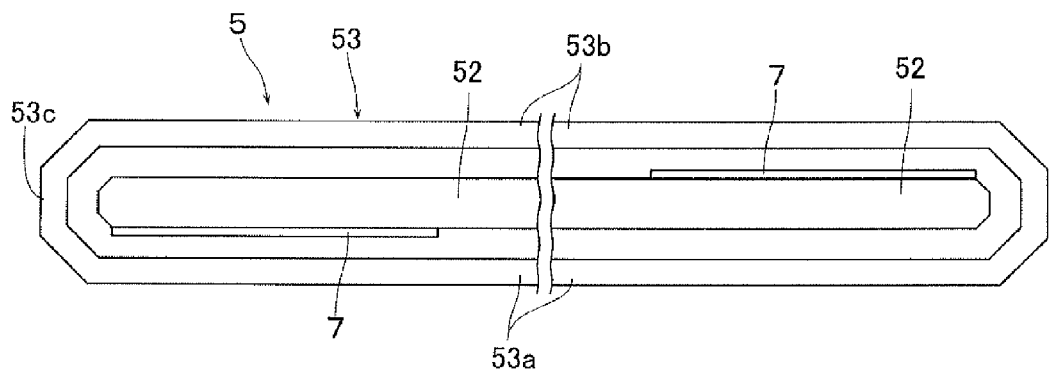
FIG. 3(a) is a view explaining the constitution of the magnet assembly according to the first embodiment.
Figure 3B:
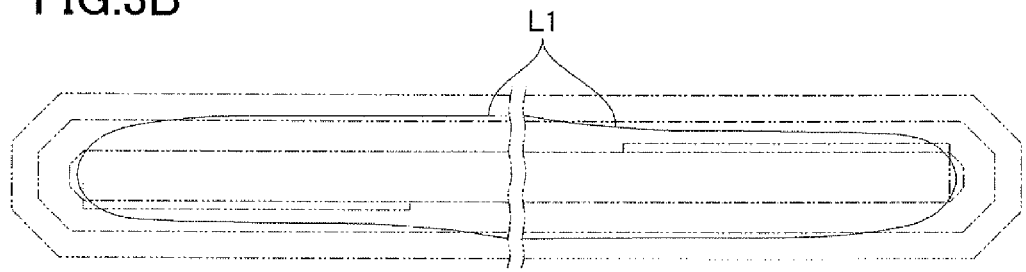
FIG. 3(b) is a view explaining a racetrack-shaped line passing through a point at which vertical component of the magnetic field becomes zero.
Figure 3C:
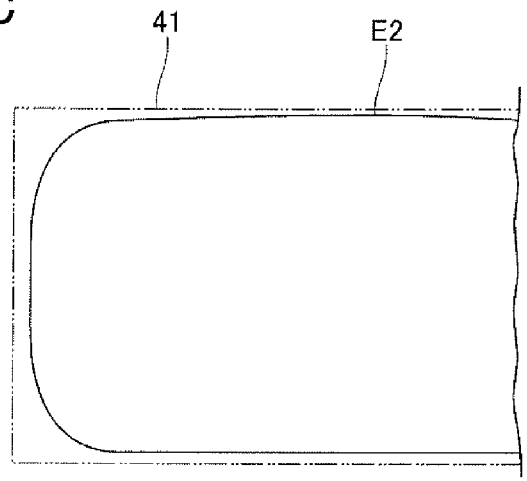
FIG. 3(c) is a view explaining the eroded region of target associated with the progress of sputtering.
Figure 4A:
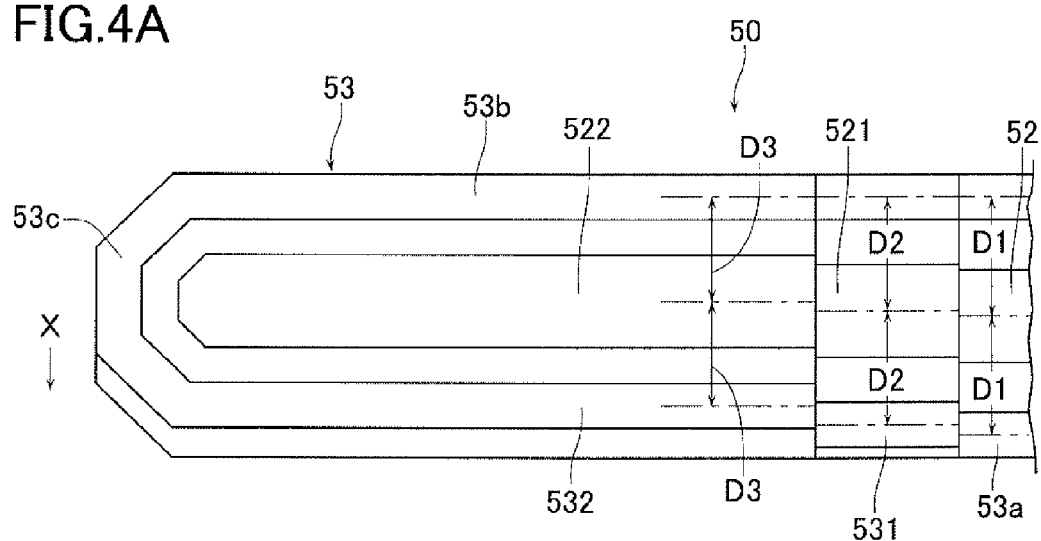
FIG. 4(a) is a view explaining the constitution of a magnet assembly according to the second embodiment.
Figure 4B:
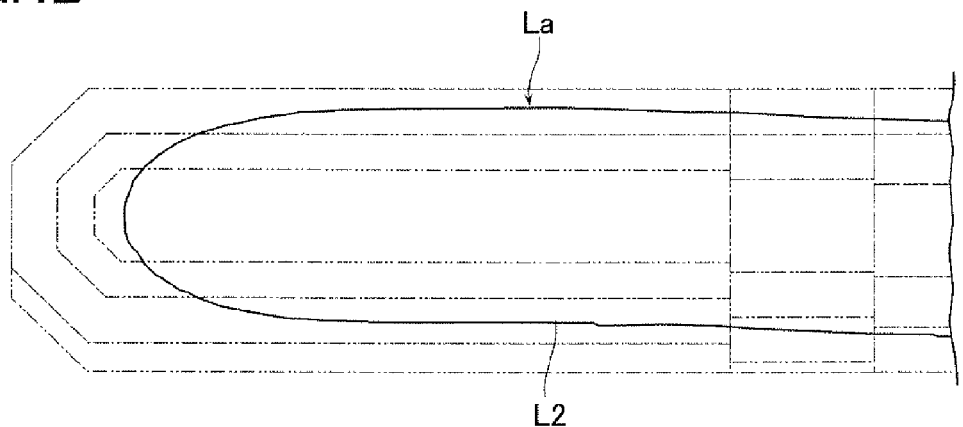
FIG. 4(b) is a view explaining the correction of the racetrack.
Figure 4C:
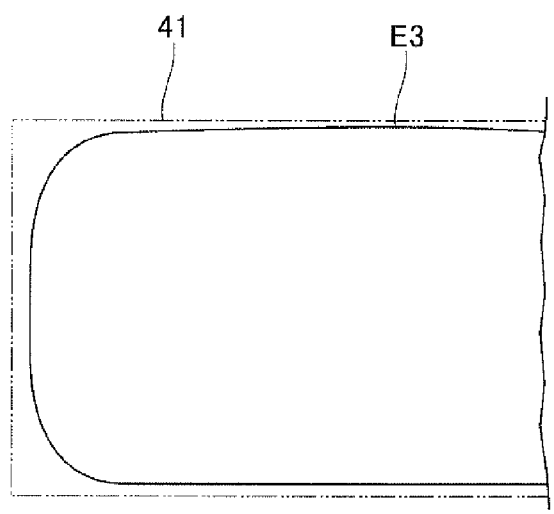
FIG. 4(c) is a view explaining the eroded region of target associated with the progress of sputtering.
Figure 5A:
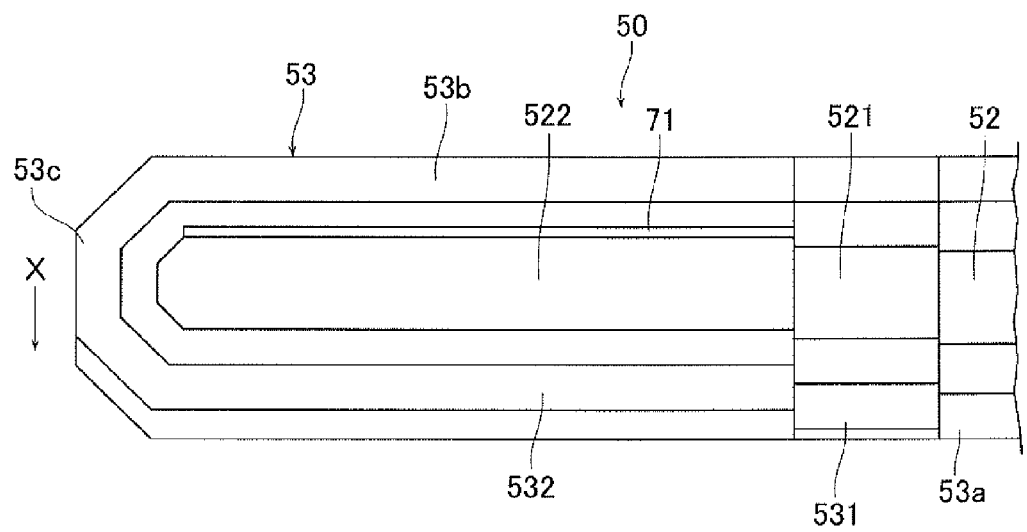
FIG. 5(a) is a view explaining the constitution relating to a modified example of a magnet assembly and FIG. 5(b) is a view explaining the correction of the position of a racetrack-shaped line passing through a position at which the vertical component of the magnetic field becomes zero.
Figure 5B:
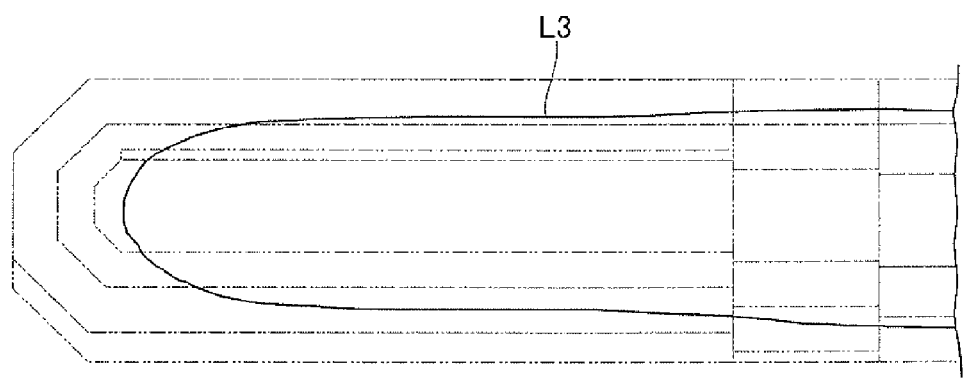
Figure 6A:
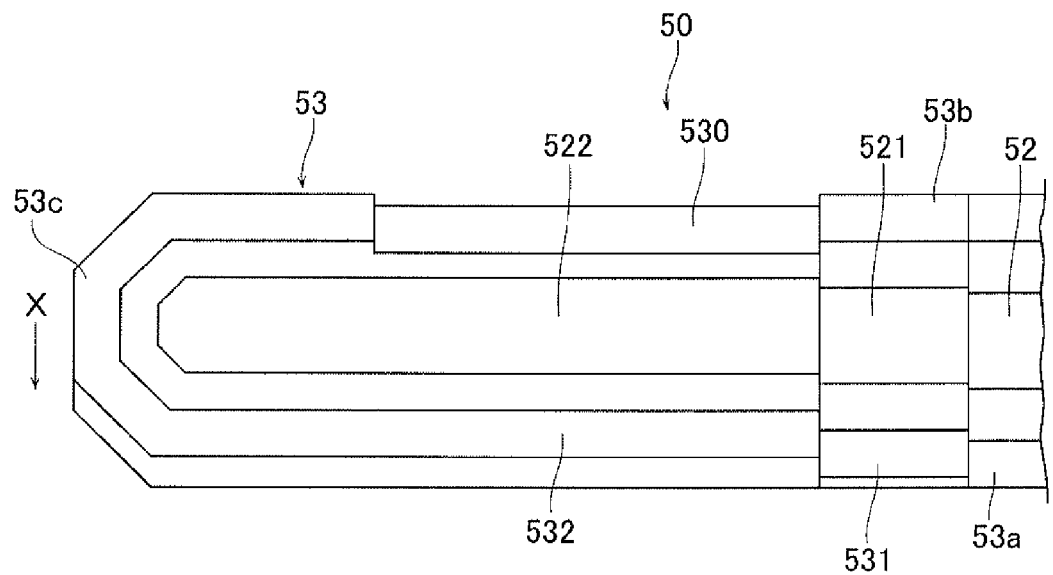
FIG. 6(a) is a view explaining the constitution relating to still another modified example of a magnet assembly and FIG. 6(b) is a view explaining the correction of the position of a racetrack-shaped line passing through a position at which the vertical component of the magnetic field becomes zero.
Figure 6B:
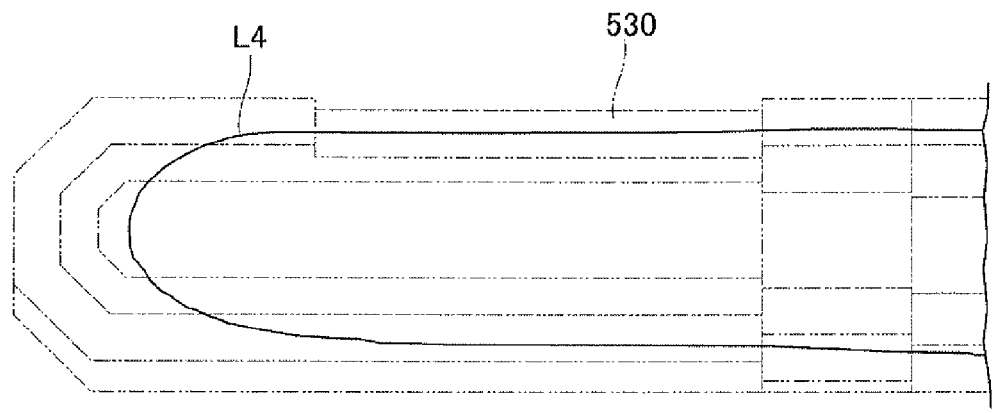
Figure 7A:
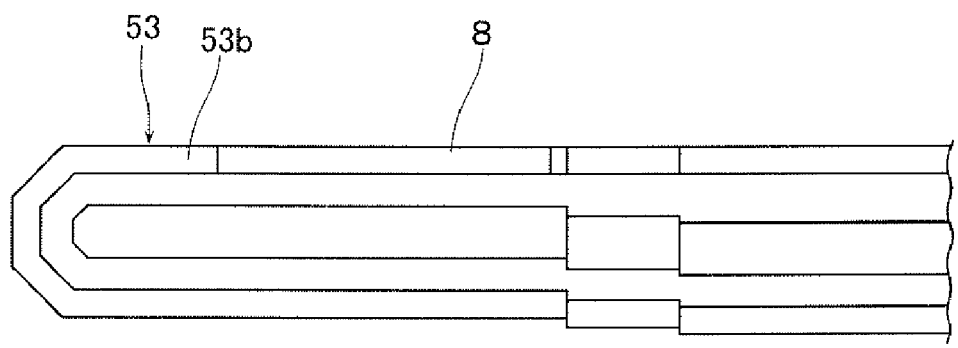
FIG. 7(a) and FIG. 7(b) are views explaining the constitution of still another modified example of the magnet assembly shown in FIG. 4.
Figure 7B:
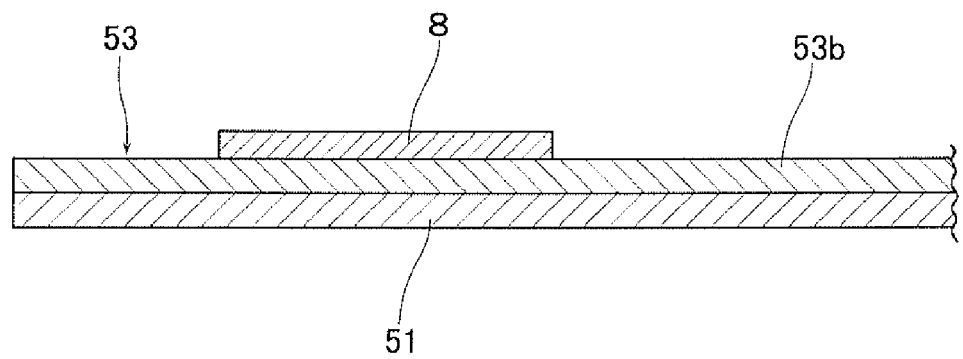

DESCRIPTION OF REFERENCE NUMERALS 1 magnetron sputtering apparatus
41 target
5, 50 magnet assembly
52 central magnet
53 peripheral magnet
53a, 53b straight portion
53c turned portion
C magnetron sputtering electrode
S process substrate

What is claimed is:
1. A magnetron sputtering electrode comprises:
a target adapted to be disposed to face a process substrate;
a magnet assembly disposed behind the target so as to lie opposite to the process substrate, the magnet assembly having
a central magnet disposed linearly and
a peripheral magnet disposed so as to enclose the central magnet with a polarity on a side of the target different from the polarity of the central magnet,
wherein a position in which a vertical component of a magnetic field becomes zero in respective magnetic fluxes generated in a tunnel shape between the central magnet and the peripheral magnet at both longitudinal end portions of the magnet assembly is shifted to the central magnet within a certain range, and
wherein the range of shifting the position in which the vertical component of the magnetic field becomes zero lies on one side of the central magnet in a manner to be diagonally crossing with each other on both end portions of the central magnet.

2. The magnetron sputtering electrode according to claim 1, wherein the magnetic force of at least one of the central magnet and the peripheral magnet is locally strengthened or weakened.

3. The magnetron sputtering electrode according to claim 1, the magnet assembly further comprising:
predetermined lengths of magnetic shunts disposed on a side surface of longitudinal both ends of the central magnet.

4. The magnetron sputtering electrode according to claim 1,
wherein the straight portions of the peripheral magnet are at an equal distance from the central magnet along a transverse direction to a longitudinal direction, and
wherein the distance between the central magnet and each of the straight portions along the transverse direction to the longitudinal direction is made smaller at both longitudinal end portions of the magnet assembly than at a longitudinal central portion of the magnet assembly.

5. The magnetron sputtering electrode according to claim 4,
wherein one of the straight portions of the peripheral magnet and both end portions of the central magnet are located closer to the other of the straight portions to thereby narrow the distance, and
wherein longitudinal both end portions of the magnet assembly are rotational symmetry.

6. The magnetron sputtering electrode according to claim 4, further comprising:
a magnetic shunt provided on a side surface of the central magnet.

7. The magnetron sputtering electrode according to claim 4, wherein at least part of the portion lying opposite to longitudinal both end portions of the magnet assembly is moved to the central magnet.

8. The magnetron sputtering electrode according to claim 4, further comprising:
an auxiliary magnet provided at least to an upper surface of the portions that lie opposite to longitudinal both end portions of the magnet assembly.

9. The magnetron sputtering electrode according to claim 1, further comprising
a driving means for reciprocating the magnet assembly in parallel with a rear surface of the target.

10. A sputtering apparatus comprising:
a magnetron sputtering electrode according to claim 1, disposed in a sputtering chamber that can be evacuated;
a gas introducing means for introducing a predetermined gas into the sputtering chamber; and
a sputtering power source that can charge electric power to the target.

11. The magnetron sputtering electrode according to claim 1, wherein the magnetic force of at least one of the central magnet and the peripheral magnet is locally strengthened or weakened.

12. The magnetron sputtering electrode according to claim 4, further comprising a driving means for reciprocating the magnet assembly in parallel with a rear surface of the target.

13. The sputtering apparatus according to claim 3, wherein the predetermined lengths of magnetic shunts are disposed on alternate side surfaces and opposite longitudinal ends of the central magnet.

* * * * *